United States Patent
Matsumoto et al.

(10) Patent No.: US 7,851,836 B2
(45) Date of Patent: Dec. 14, 2010

(54) THIN-FILM TRANSISTOR TYPE PHOTOSENSOR

(75) Inventors: Hiroshi Matsumoto, Higashiyamato (JP); Ikuhiro Yamaguchi, Tokyo (JP); Hirokazu Kobayashi, Otsuki (JP)

(73) Assignee: Casio Computer Co., Ltd., Tokyo (JP)

( * ) Notice: Subject to any disclaimer, the term of this patent is extended or adjusted under 35 U.S.C. 154(b) by 293 days.

(21) Appl. No.: 12/004,231

(22) Filed: Dec. 20, 2007

(65) Prior Publication Data

US 2008/0157136 A1 Jul. 3, 2008

(30) Foreign Application Priority Data

Dec. 27, 2006 (JP) .............................. 2006-350769

(51) Int. Cl.
*H01L 31/113* (2006.01)

(52) U.S. Cl. ........................... 257/290; 257/59; 257/72; 257/291; 257/436; 257/448; 257/459; 257/E31.085; 257/E31.124; 257/E29.117; 257/E29.12; 257/E31.125

(58) Field of Classification Search ........................ None
See application file for complete search history.

(56) References Cited

U.S. PATENT DOCUMENTS

| | | | |
|---|---|---|---|
| 5,302,987 A * | 4/1994 | Kanemori et al. ............ | 349/143 |
| 6,670,595 B1 * | 12/2003 | Sasaki et al. ............. | 250/208.1 |
| 2005/0041168 A1 * | 2/2005 | Jang et al. ..................... | 349/43 |
| 2006/0124828 A1 | 6/2006 | Shin | |
| 2008/0129942 A1 | 6/2008 | Shin | |

FOREIGN PATENT DOCUMENTS

| | | |
|---|---|---|
| EP | 0 449 598 A2 | 10/1991 |
| JP | 8-213584 A | 8/1996 |

OTHER PUBLICATIONS

Gadelrab. S. M. et al "Performance of Photo-Transistors With Thin (50 NM) a-Si:H Layers" Amorphous Silicon Technology 1995. San Francisco, Apr. 18-21, 1995; (MRS Symposium Proceedings), Pittsburgh, MRS, US, vol. 377, Apr. 18, 1995, pp. 713-718, XP000656369, ISBN: 978-1-55899-280-1.
English Language International Search Report and Written Opinion dated Jul. 18, 2008 issued in counterpart Appln. No. PCT/JP2007/074587.

* cited by examiner

*Primary Examiner*—Jerome Jackson, Jr.
*Assistant Examiner*—Yu Chen
(74) *Attorney, Agent, or Firm*—Holtz, Holtz, Goodman & Chick, PC

(57) ABSTRACT

A photosensor includes a semiconductor thin film for photoelectric conversion having a first side portion and a second side portion. A source electrode extends in the longitudinal direction of the semiconductor thin film and has a side edge portion that overlaps the first side portion of the semiconductor thin film, and a drain electrode extends in the longitudinal direction and has a side edge portion that overlaps the second side portion of the semiconductor thin film. At least one of the side edge portions of the source and drain electrodes has protruding portions which are arranged along the longitudinal direction and which overlap the semiconductor thin film, and notched portions formed between the protruding portions. An ohmic contact layer is formed between the semiconductor thin film and the protruding portions of the at least one of the side edge portions of the source and drain electrodes.

16 Claims, 15 Drawing Sheets

THIN-FILM TRANSISTOR TYPE PHOTOSENSOR

CROSS-REFERENCE TO RELATED APPLICATIONS

This application is based upon and claims the benefit of priority from prior Japanese Patent Application No. 2006-350769, filed Dec. 27, 2006, the entire contents of which are incorporated herein by reference.

BACKGROUND OF THE INVENTION

1. Field of the Invention

The present invention relates to a thin-film transistor photosensor.

2. Description of the Related Art

Conventionally, as a photosensor, a transistor type structure having a semiconductor thin film for photoelectric conversion formed under a gate insulating film is known. A thin-film transistor structure using amorphous silicon for a semiconductor thin film for photoelectric conversion, because of the necessity of mounting a photosensor on an insulating substrate, is also well known.

Jpn. Pat. Appln. KOKAI Publication No. 8-213584 discloses such a thin-film transistor type photosensor. The photosensor disclosed in JP 08-213584 has a bottom gate electrode, which is made of a light-shielding conductive material, and which is formed under a bottom gate insulating film formed under a semiconductor thin film for photoelectric conversion that is made of amorphous silicon. In this conventional structure, moreover, a top gate insulating film is formed on the semiconductor thin film, and a top gate electrode made of a light-transmitting conductive material is provided on the top gate insulating film. Still further, source and drain electrodes made of a light-shielding conductive material are provided on a pair of ohmic contact layers made of n-type amorphous silicon on two sides of the upper surface of the semiconductor thin film under the top gate insulating film. In this case, the opposing end faces of the source and drain electrodes are parallel to each other, and the distance between them corresponds to a channel length. Due to this structure of the source and drain electrodes in the photosensor disclosed in JP 08-213584, the end portions of the source and drain electrodes that face each other and are parallel to each other block light that would otherwise obliquely strike the photoelectric conversion semiconductor thin film, in particular. This makes it impossible to ensure sufficient photosensitivity (the ratio light current/dark current).

SUMMARY OF THE INVENTION

A photosensor according to one aspect of the present invention includes a semiconductor thin film for photoelectric conversion having an elongated planar shape and including a first side portion extending in a longitudinal direction of the elongated shape and a second side portion extending in the longitudinal direction. A source electrode extends in the longitudinal direction and includes a side edge portion that overlaps the first side portion of the semiconductor thin film, and a drain electrode extends in the longitudinal direction and includes a side edge portion that overlaps the second side portion of the semiconductor thin film. At least one of the side edge portion of the source electrode and the side edge portion of the drain electrode includes protruding portions which are arranged along the longitudinal direction and which overlap the semiconductor thin film, and notched portions formed between the protruding portions. An ohmic contact layer is formed between the semiconductor thin film and the at least one of the side edge portion of the source electrode and the side edge portion of the drain electrode.

Advantages of the invention will be set forth in the description that follows, and in part will be obvious from the description, or may be learned by practice of the invention. Advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

First Embodiment

Figure 1:
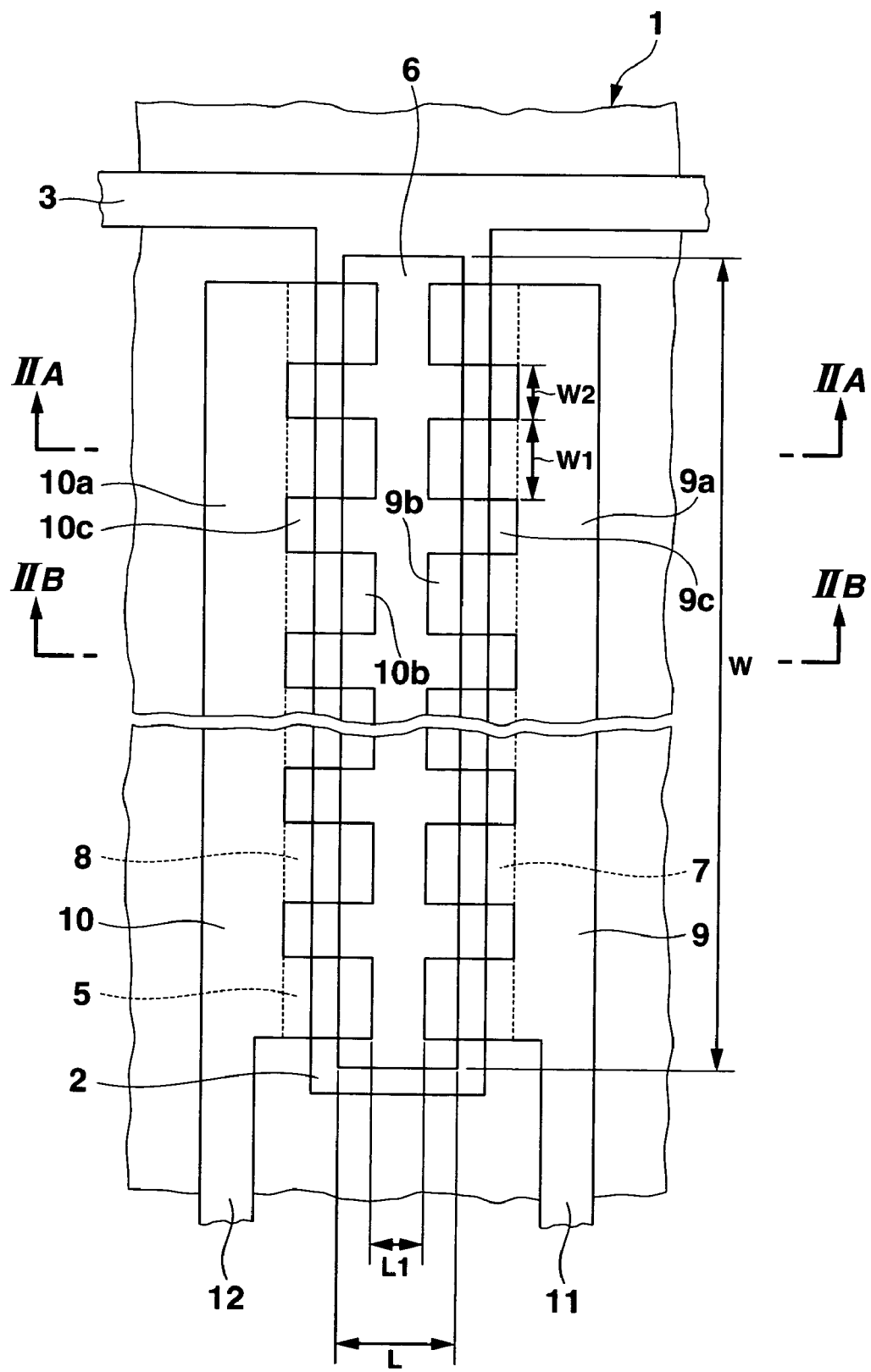
FIG. 1 is a transparent plan view (assuming that all elements are transparent) of a photosensor according to the first embodiment of the present invention.

FIGS. 1-4 illustrate the structure of the first embodiment of the present invention. FIG. 1 is a transparent plan view of a photosensor according to the first embodiment of the present invention. FIG. 2A is a sectional view taken along line $II_A$-$II_A$ of FIG. 1. FIG. 2B is a sectional view taken along line $II_B$-$II_B$ of FIG. 1.

A photosensor according to the first embodiment includes a substrate 1 made of glass or the like. A strip gate electrode 2 made of chromium or the like and a gate line 3, which is connected to the gate electrode 2, are provided on the upper surface of the substrate 1.

A gate insulating film 4 made of silicon nitride or the like is provided on the upper surface of the substrate 1 and covers the gate electrode 2 and gate line 3. A semiconductor thin film 5 for photoelectric conversion, which is made of intrinsic amorphous silicon, is provided on the upper surface of the gate insulating film 4 and is positioned over the gate electrode 2.

A strip channel protective film 6 made of silicon nitride or the like is provided on a middle portion of the upper surface of the semiconductor thin film 5 in the direction of a channel length L (that is, over a channel region of the semiconductor thin film 5). Ohmic contact layers 7 and 8 made of n-type amorphous silicon are provided on respective sides of the upper surface of the channel protective film 6 in the direction of the channel length L and on the upper surface of the semiconductor thin film 5 at the respective sides.

A source electrode 9 and a drain electrode 10, which are made of chromium or the like, are provided on the upper surfaces of the ohmic contact layers 7 and 8, respectively, and on portions of the upper surface of the gate insulating film 4 that are located near the ohmic contact layers 7 and 8. A source line 11 and a drain line 12, which are made of chromium or the like, are provided on portions of the upper surface of the gate insulating film 4 to be connected to the source electrode 9 and the drain electrode 10, respectively. An overcoat film 13 made of silicon nitride is provided on the upper surface of the gate insulating film 4 to cover the channel protective film 6, the source electrode 9, the drain electrode 10, the source line 11, and the drain line 12 (See FIGS. 2A and 2B).

The planar shapes of the semiconductor thin film 5, the ohmic contact electrodes 7 and 8, and the source electrode 9 and drain electrode 10 are described below.

As shown in FIG. 1, the source electrode 9 and the drain electrode 10 have generally toothed-comb-like planar shapes, including strip portions 9a and 10a, and square protruding portions 9b and 10b. The square protruding portions 9b are provided at equal intervals on the side of the strip 9a opposed to the strip portion 10a, and the square protruding portions 10b are provided at equal intervals on the side of the strip portion 10a opposed to the strip portion 9a. Square notched portions 9c are provided between the protruding portions 9b, and square notched portions 10c are provided between the protruding portions 10b. All of the protruding portions 9b of the source electrode 9 and all of the protruding portions 10b of the drain electrode 10 have the same width W1 in a channel width direction (the longitudinal direction that is perpendicular to the channel length direction L), and all of the notched portions 9c of the source electrode 9 and all of the notched portions 10c of the source electrode 10 have the same width W2 in the channel width direction. And the respective side edge portions of the protruding portions 9b (the notched portions 9c) are arranged at positions aligned with the respective side edge portions of the opposing protruding portions 10b (the notched portions 10c).

Figure 2A:
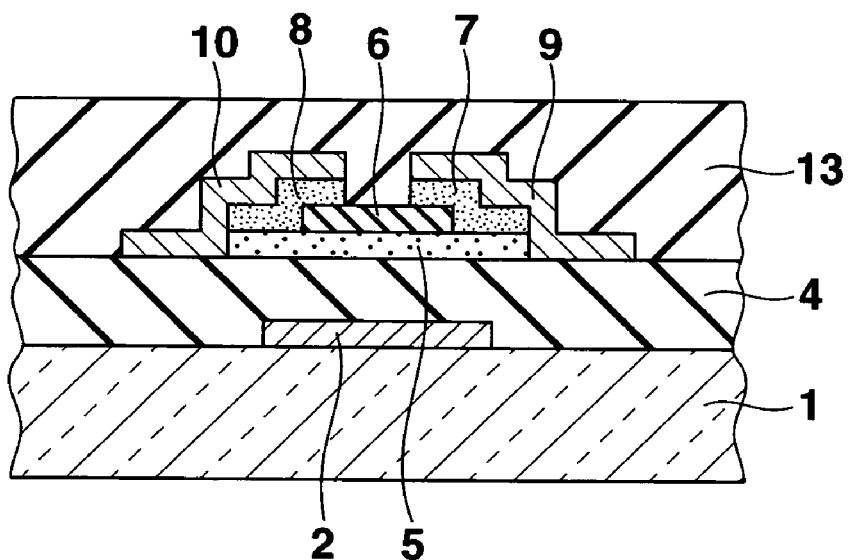
FIG. 2A is a sectional view taken along line $II_A$-$II_A$ of FIG. 1.
Figure 2B:
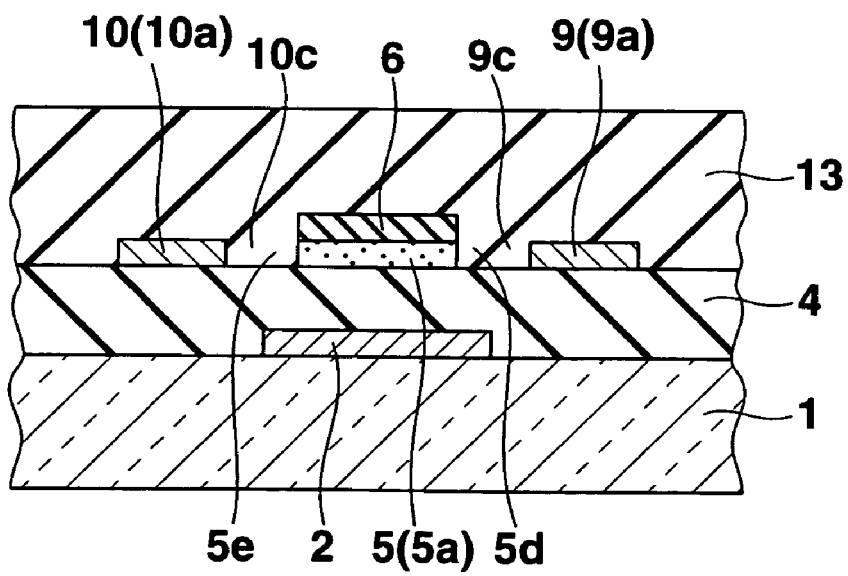
FIG. 2B is a sectional view taken along line $II_B$-$II_B$ of FIG. 1.
Figure 3:
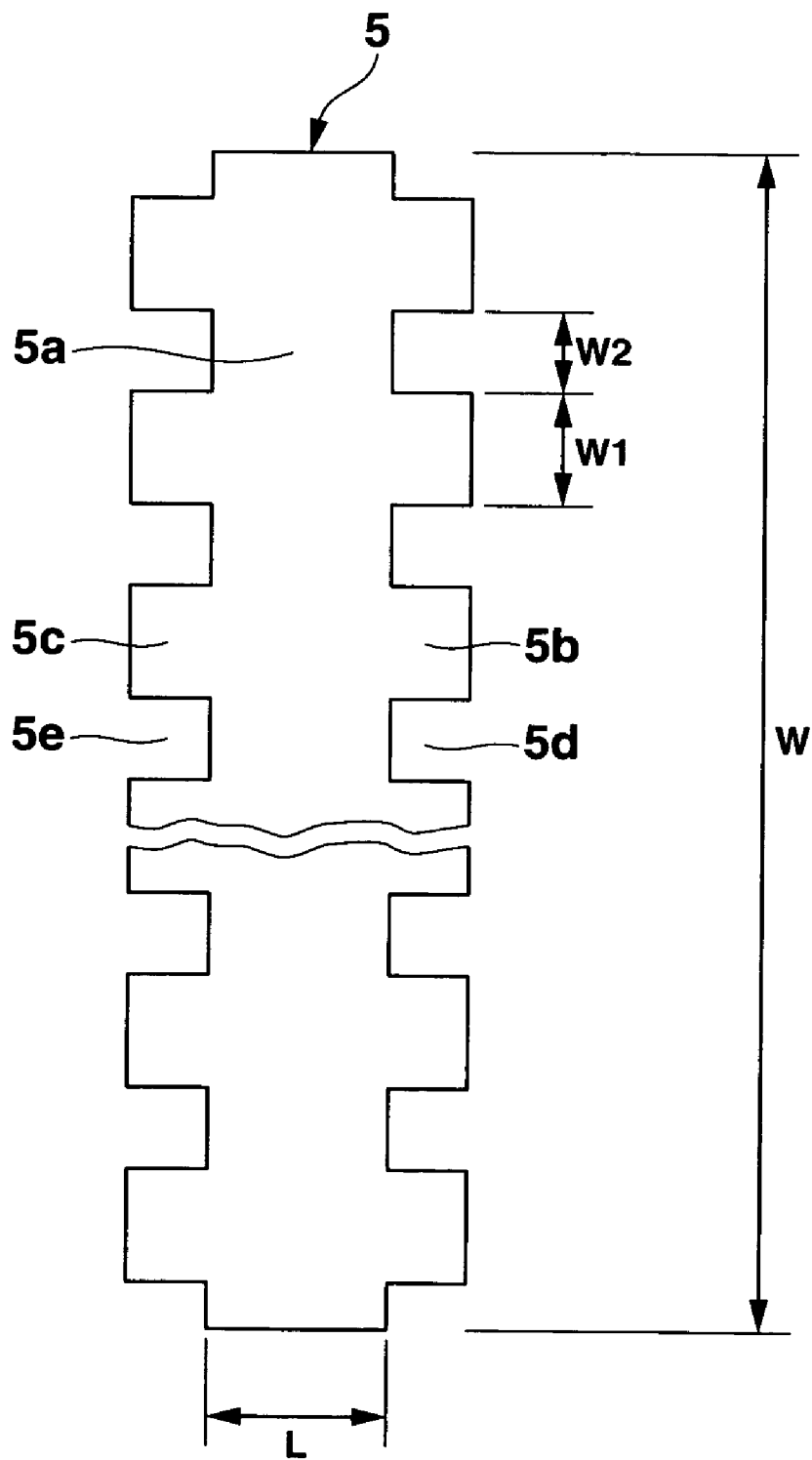
FIG. 3 is a plan view of a semiconductor thin film for photoelectric conversion shown in FIGS. 1, 2A, and 2B.

As shown in FIG. 3, the semiconductor thin film 5 includes a strip portion 5a provided under the channel protective film 6 (see FIG. 2B), and includes square protruding portions 5b and 5c provided at equal intervals along the longitudinal direction on respective sides of the strip portion 5a. The protruding portions 5b and 5c have the same width W1 in the channel width direction as the protruding portions 9b and 10b of the source and drain electrodes 9 and 10. Square notched portions 5d are provided at equal intervals in the longitudinal direction between the protruding portions 5b, and square notched portions 5e are provided at equal intervals in the longitudinal direction between the protruding portions 5c. The notched portions 5d and 5e have the same width W2 in the channel width direction as the notched portions 9c and 10c of the source and drain electrodes 9 and 10.

The notched portions 5d and 5e are provided at positions corresponding to the notched portions 9c and 10c, respectively, of the source electrode 9 and drain electrode 10 shown in FIG. 1. The protruding portions 5b and 5c are provided at positions corresponding to the protruding portions 9b and 10c, respectively, of the source electrode 9 and drain electrode 10 shown in FIG. 1.

The end faces of the semiconductor thin film 5 at the bases of the notched portions 5d and 5e are located at the same positions as the two end faces of the channel protective film 6 in the direction of the channel length L shown in FIG. 1 (see FIG. 2B). Moreover, the end faces of the semiconductor thin film 5 in the direction of the channel length L at the tips of the protruding portions 5b and 5c are located at the same positions as the end face (left end face in FIG. 1) of the source electrode 9 and the end face (right end face in FIG. 1) of the drain electrode 10, respectively, at the bases of the notched portions 9c and 10c shown in FIG. 1 (although the protruding portions 5b and 5c are actually provided under the protruding portions 9c and 10c, respective). Thus, the outside end faces of the source electrode 9 (right end face in FIG. 1) and drain electrode 10 (left end face in FIG. 1) are located outside the two end faces of the semiconductor thin film 5 in the direction of the channel length L.

Figure 4:
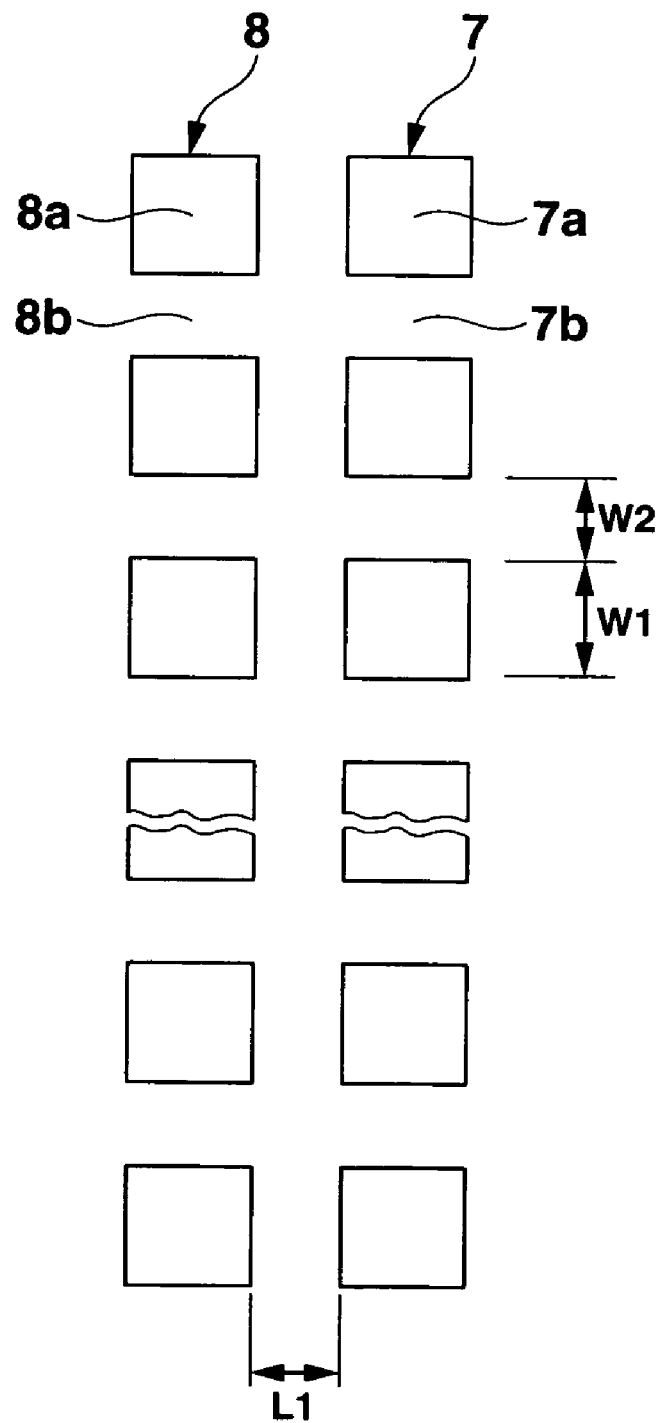
FIG. 4 is a plan view of an ohmic contact layer shown in FIGS. 1, 2A, and 2B.

As shown in FIG. 4, the ohmic contact layers 7 and 8 include square portions (discrete islands) 7a and 8a, respectively, provided at equal intervals in the direction of a channel width W (the longitudinal direction that is perpendicular to the channel length direction). The square portions 7a and 8a have the same width W1 as the protruding portions 5b and 5c of the semiconductor thin film 5 and the protruding portions 9b and 10b of the source and drain electrodes 9 and 10. Spaces 7b are provided between the square portions 7a, and spaces 8b are provided between the square portions 8a. The spaces 7b and 8b have the same width W2 in the channel width direction as the notched portions 5d and 5e of the semiconductor thin film 5 and the notched portions 9c and 10c of the source and drain electrodes 9 and 10.

The spaces portions 7b and 8b are provided at the same positions as the notched portions 9c and 10c, respectively, of the source electrode 9 and drain electrode 10 shown in FIG. 1. The square portions 7a and 8a are provided only under the protruding portions 9b and 10b, respectively, of the source electrode 9 and drain electrode 10 shown in FIG. 1.

Thus, as described above, in photosensor according to the first embodiment, the notched portions 9c in the source electrode 9 (which is made of a light-shielding conductive material such as chromium), the spaces 7b in the ohmic contact layer 7, and the notched portions 5d of the semiconductor thin film 5 are provided at the same positions; and the notched portions 10c in the drain electrode 10 (which is made of a light-shielding conductive material such as chromium), the spaces 8b of the ohmic contact layer 8, and the notched portions 5e of the semiconductor thin film 5 are provided at the same positions. These notched portions serve as light-transmitting portions, and hence can increase not only the amount of light striking the semiconductor thin film 5 from directly above but also the amount of light striking the semiconductor thin film 5 from an oblique direction (striking obliquely from above from the right side and the left side in FIG. 1, in particular).

As shown in FIG. 2B, the source electrode 9 and the drain electrode 10 are not formed on the semiconductor thin film 5 at portions corresponding to the notched portions 5d, (spaces 7b), and 9c and the notched portions 5e, (spaces 8b), and 10c. However, since currents flow into the semiconductor thin film 5 due to the fringe effect (channel edge effect) of the ohmic contact layers 7 and 8 provided under the source electrode 9 and the drain electrode 10 at the portions corresponding to the protruding portions 9b and 10b, sufficient amounts of optical currents also flow into the semiconductor thin film 5 in spite of a formation of the notched portions 5d and 5e in the semiconductor thin film 5.

If, however, the width W2 in the channel width W direction of each of the notched portions 5d, 5e, 9c and 10c and the spaces 7b and 8b increases to some extent, the amount of current that flows due to the fringe effect decreases. Accordingly, the width W2 of each notched portion of the semiconductor thin film 5 is preferably equal to or shorter than the channel length L. Moreover, in general, a distance L1 between the source electrode 9 and the drain electrode 10 in the channel length direction in FIG. 1 is set to about a minimum size (several µm in general) that allows an etching process when patterning the source electrode 9 and the drain electrode 10.

The width W2 of each notched portion of the semiconductor thin film 5 in the channel width direction is not specifically limited but is preferably set to about a minimum size that allows an etching process when patterning the semiconductor thin film 5, in order to satisfactorily obtain the fringe effect described above. Thus, both the width W2 of each notched portion of the semiconductor thin film 5 in the channel width direction and the distance L1 between the source electrode 9 and the drain electrode 10 in the channel length direction are preferably set as the minimum feature size (for patterning). In other words, they are preferably the same size, or generally the same size.

An experimental example will be described next. As a photosensor, an apparatus was prepared (to be referred to as an apparatus according to the present invention hereinafter) in which: the channel width W was 20,000 µm; the width W1 (e.g., of each of the protruding portions 9b and 10b of the source electrode 9 and drain electrode 10 in the direction of the channel width W) was 6 µm; the width W2 (e.g., of each of the notched portions 5d and 5e in the channel width direction) was 4 µm; the channel length L was 9 µm; and the distance L1 was 4 µm.

In addition, as a photosensor for comparison, an apparatus was prepared (to be referred to as a comparative apparatus hereinafter) without the notched portions or spaces 5d, 5e, 7b, 8b, 9c, and 10c of the semiconductor thin film 5, ohmic contact layers 7 and 8, source electrode 9, and drain electrode 10.

That is, in this comparative apparatus, the source and drain electrodes were simple strip components having sizes in the direction of the channel length L equal to the sizes of the source electrode 9 and drain electrode 10 in the direction of the channel length L at positions corresponding to the tips of the protruding portions 9b and 10b. Moreover, in the comparative apparatus, the semiconductor thin film for photoelectric conversion was a simple strip member having a size in the direction of the channel length L equal to the size of the semiconductor thin film 5 in the direction of the channel length L at positions corresponding to the tips of the protruding portions 5b and 5c. Still further, in the comparative apparatus, a pair of ohmic contact layers were simple strip members having sizes in the direction of the channel length L equal to the sizes in the direction of the channel length L of the square portions 7a and 8a.

Figure 5:
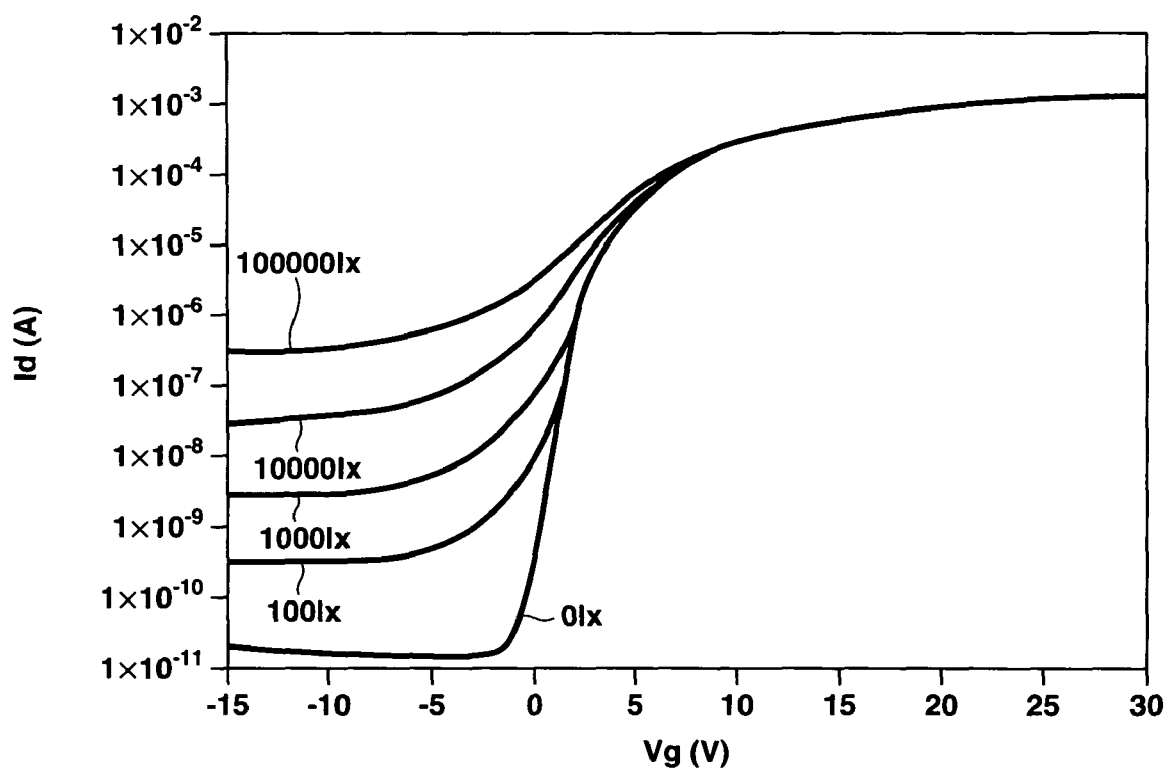
FIG. 5 is a graph showing a Vg-Id characteristic with respect to the light intensity (illuminance) of an apparatus according to the present invention.
Figure 6:
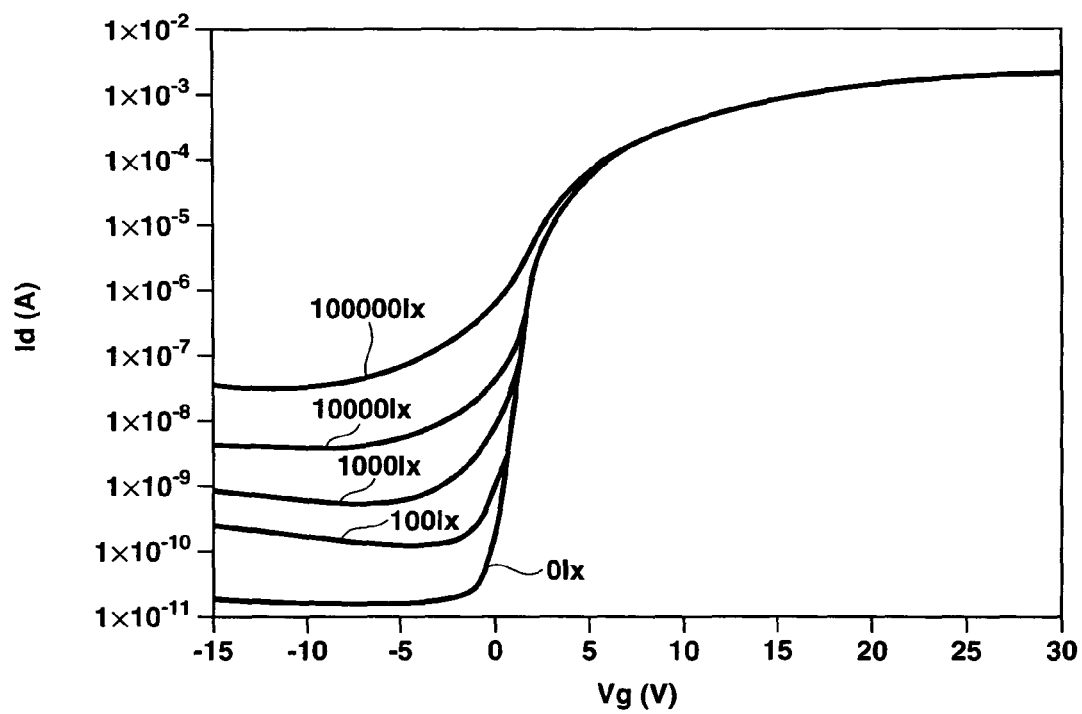
FIG. 6 is a graph showing a Vg-Id characteristic with respect to the light intensity (illuminance) of a comparative apparatus.
Figure 7:
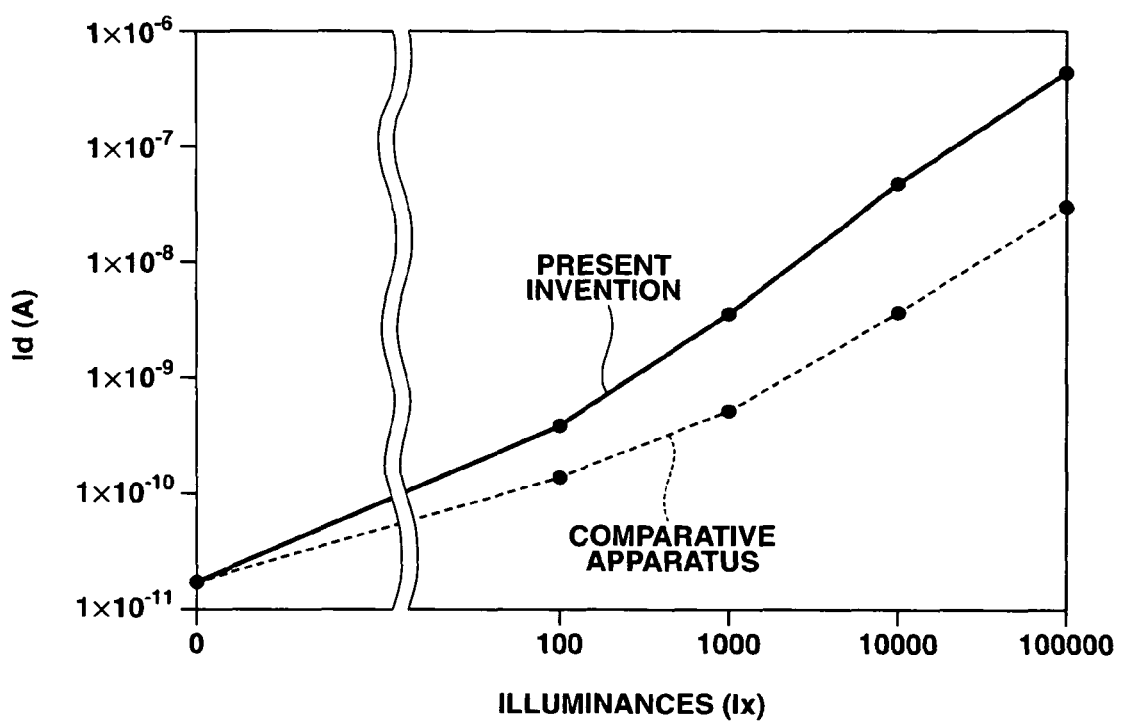
FIG. 7 is a graph showing OFF current characteristics with respect to the light intensities (illuminances) of the apparatus according to the present invention and the comparative apparatus that are obtained from FIGS. 5 and 6.

When the Vg-Id characteristics of the apparatus according to the present invention and the comparative apparatus corresponding to light intensities (illuminances) of 0 lx, 100 lx, 1000 lx, 10000 lx, and 100000 lx were checked with the source and drain voltages being set to 0V and 10 V, respectively, the results shown in FIG. 5 (the apparatus according to the present invention) and FIG. 6 (the comparative apparatus) were obtained. The results shown in FIG. 7 were obtained when OFF currents corresponding to light intensities (illuminances) were obtained with the source, drain, and gate voltages being set to 0 V, 10 V, and −10 V, respectively. Referring to FIG. 7, the solid line and the dotted line respectively represent the results of the apparatus according to the present invention and the comparative apparatus.

As is obvious from FIG. 7, although the value of dark current (0 lx) in the apparatus according to the present invention represented by the solid line is generally equal to the value of dark current (0 lx) in the comparative apparatus represented by the dotted line, the values of light currents (100 to 10000 lx) in the apparatus according to the present invention were larger than the values of light currents (100 to 10000 lx) in the comparative apparatus represented by the dotted line by about one order of magnitude. That is, the photosensitivity (the ratio light current/dark current) of the apparatus according to the present invention increases by about one order of magnitude as compared with the comparative apparatus.

Second Embodiment

Figure 8:
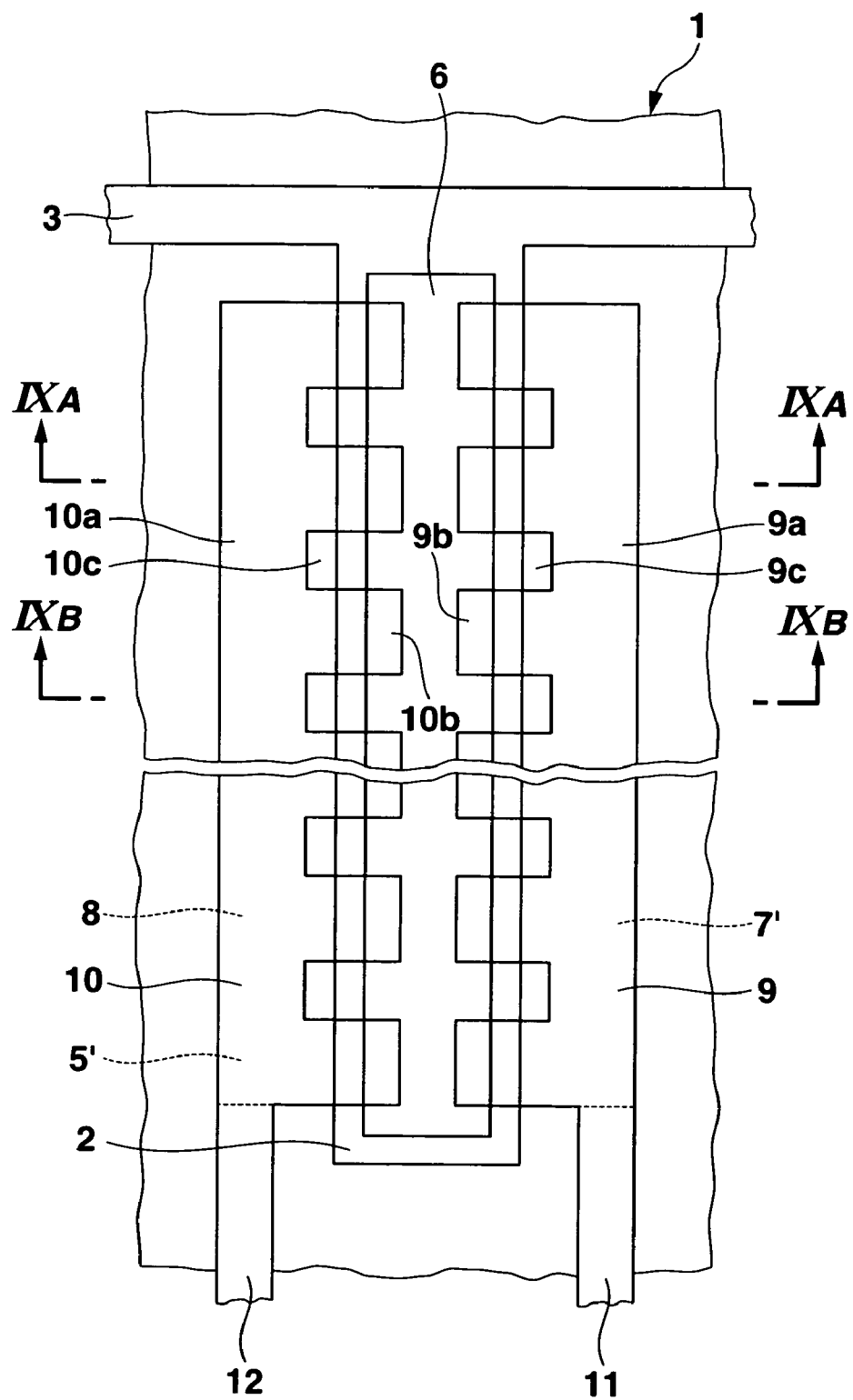
FIG. 8 is a transparent plan view (assuming that all elements are transparent) of a photosensor according to the second embodiment of the present invention.
Figure 9A:
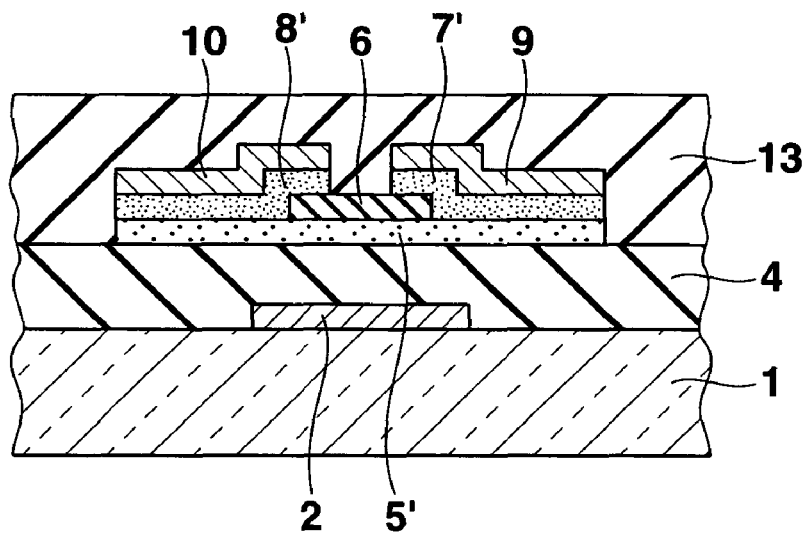
FIG. 9A is a sectional view taken along line $IX_A$-$IX_A$ of FIG. 8.
Figure 9B:
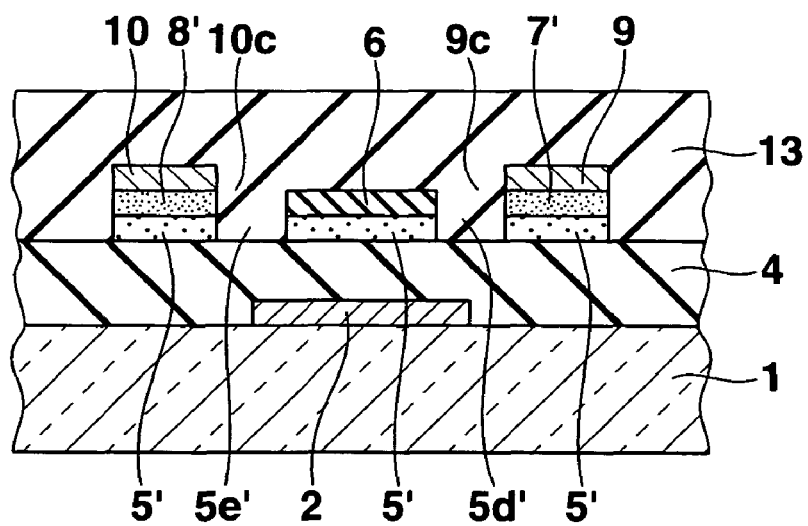
FIG. 9B is a sectional view taken along line $IX_B$-$IX_B$ of FIG. 8.
Figure 10:
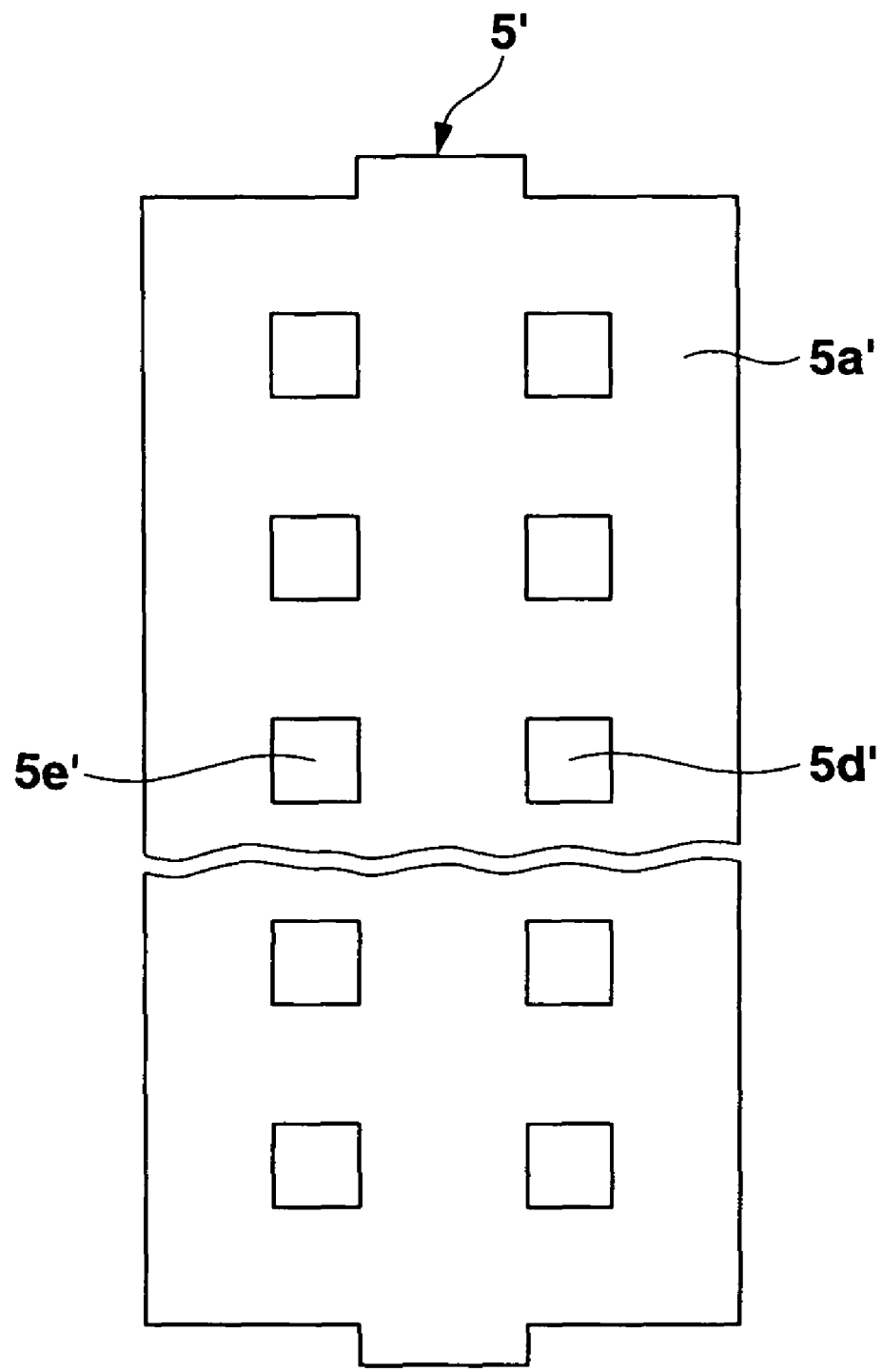
FIG. 10 is a plan view of a semiconductor thin film for photoelectric conversion shown in FIGS. 8, 9A, and 9B.
Figure 11:
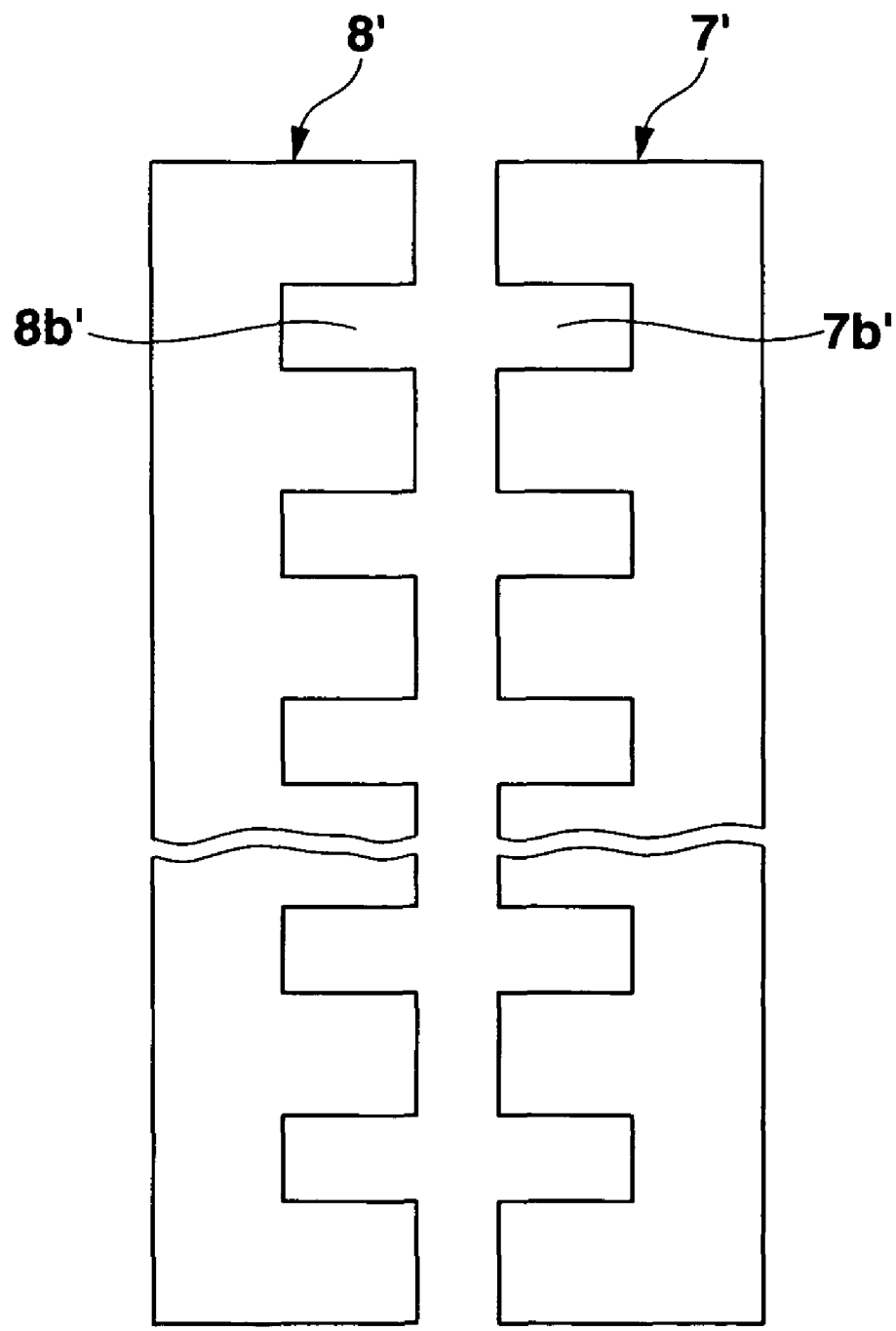
FIG. 11 is a plan view of an ohmic contact layer shown in FIGS. 8, 9A, and 9B.

FIGS. 8-11 illustrate the structure of the second embodiment of the present invention. FIG. 8 is a transparent plane view of a photosensor according to the second embodiment of the present invention. FIG. 9A is a sectional view taken along line $IX_A$-$IX_A$ of FIG. 8. FIG. 9B is a sectional view taken along line $IX_B$-$IX_B$ of FIG. 8. FIG. 10 is a plan view of a semiconductor thin film for photoelectric conversion shown in FIGS. 8, 9A, and 9B. FIG. 11 is a plan view of an ohmic contact layer shown in FIGS. 8, 9A, and 9B.

The same reference numerals are used to indicate the same elements as those described above with respect to the first embodiment. Reference numerals of structural elements of the second embodiment that differ from the corresponding elements of the first embodiment are designated with a prime symbol.

The photosensor according to the second embodiment differs from the photosensor according to the first embodiment that is shown in FIGS. 1 to 4 in that according to the second embodiment the ohmic contact layers and the semiconductor thin film for photoelectric conversion are provided under the source electrode and the drain electrode such that all of the source electrode is provided over an ohmic contact layer which is provided over a portion of the semiconductor thin film and such that all of the drain electrode is provided over an ohmic contact layer which is provided over a portion of the semiconductor thin film.

That is, as shown in FIG. 10, the semiconductor thin film 5' according to the second embodiment has a structure in which notched portions 5d', which are square holes, are arranged in a line at equal intervals in a strip portion 5a', which is wider than the strip portion 5a shown in FIG. 3, and in which notched portions 5e', which are square holes, are arranged in another line at equal intervals in the strip portion 5a'. Each notched portion 5d' has the same size in the channel length and width directions as each notched portion 9c of the source electrode 9, and the notched portions 5d' are placed at positions corresponding to the notched portions 9c, respectively. Each notched portion 5e' has the same size in the channel length and width directions as each notched portion 10c of the drain electrode 10, and the notched portions 5e' are placed at positions corresponding to the notched portions 10c, respectively.

Moreover, as shown in FIG. 11, the ohmic contact layers 7' and 8' have generally the same toothed-comb-like planar shapes as the source electrode 9 and the drain electrode 10 shown in FIG. 8, respectively. Furthermore, each notched portion 7b' of the ohmic contact layer 7' has the same size in the channel length and width directions as each of the notched portion 9c of the source electrode 9, and the notched portions 7b' are placed at positions corresponding to the notched portions 9c, respectively. Each notched portion 8b' of the ohmic contact layer 8' has the same size in the channel length and width directions as each of the notched portion 10c of the drain electrode 10, and the notched portions 8b' are placed at positions corresponding to the notched portions 10c, respectively.

Thus, with this structure, a shown in FIGS. 8 and 9, all of the source electrode 9 is provided over the ohmic contact layer 7', which is provided over a portion of the semiconductor thin film 5', and all of the drain electrode 10 is provided over the ohmic contact layer 8' which is provided over a portion of the semiconductor thin film 5'.

It should be noted that each of a source line 11' and a drain line 12' according to the second embodiment has a three-layer structure comprising an intrinsic amorphous silicon film, an n-type amorphous silicon film, and a metal film made of chromium or the like that are sequentially formed from the bottom in this order.

Third Embodiment

Figure 12:
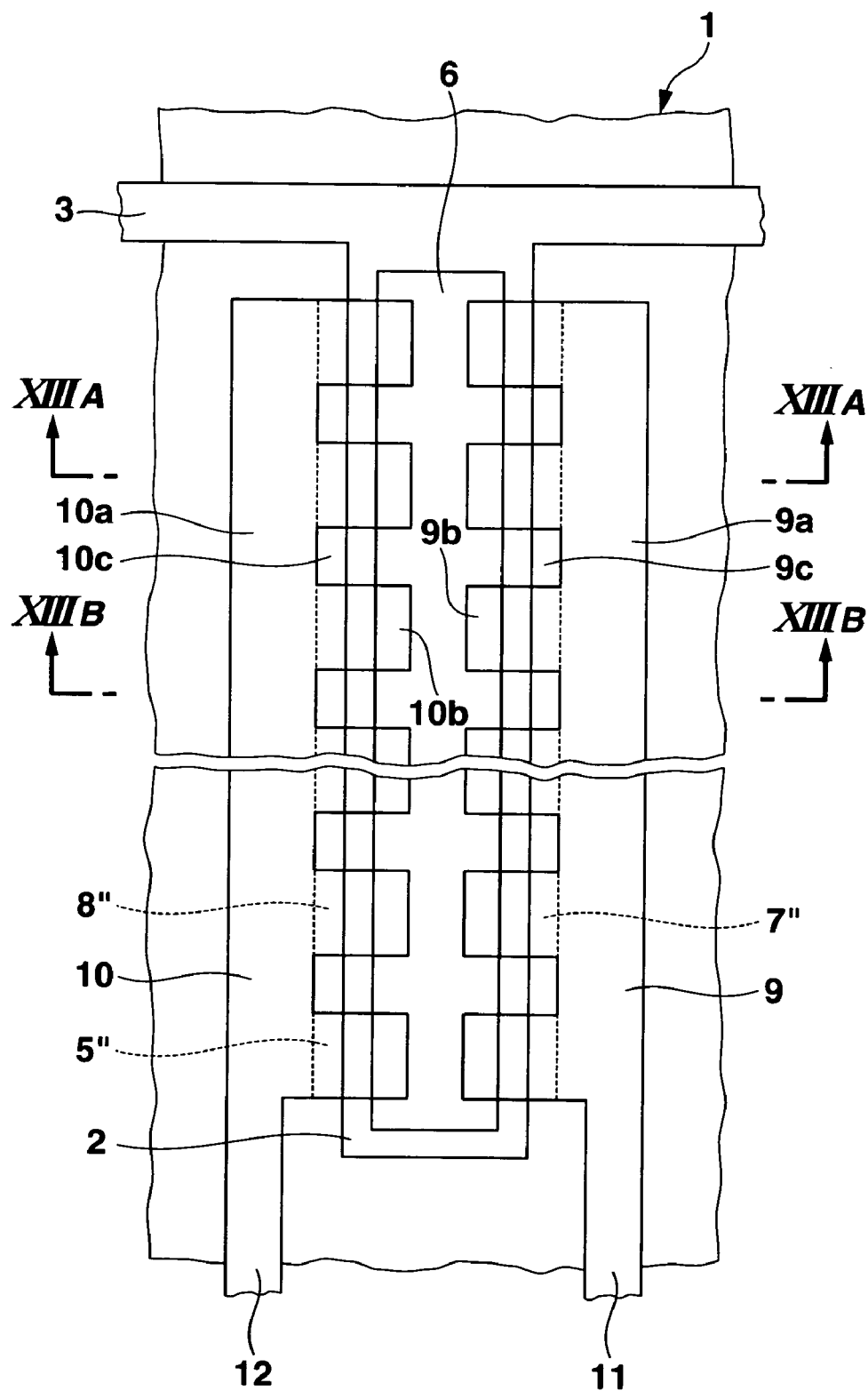
FIG. 12 is a transparent plan view (assuming that all elements are transparent) of a photosensor according to the third embodiment of the present invention.
Figure 13A:
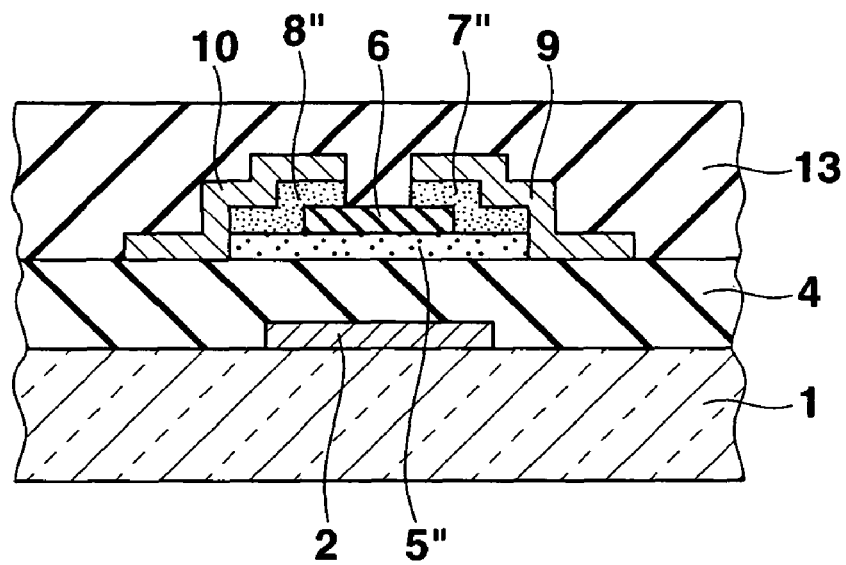
FIG. 13A is a sectional view taken along line $XIII_A$-$XIII_A$ of FIG. 12.
Figure 13B:
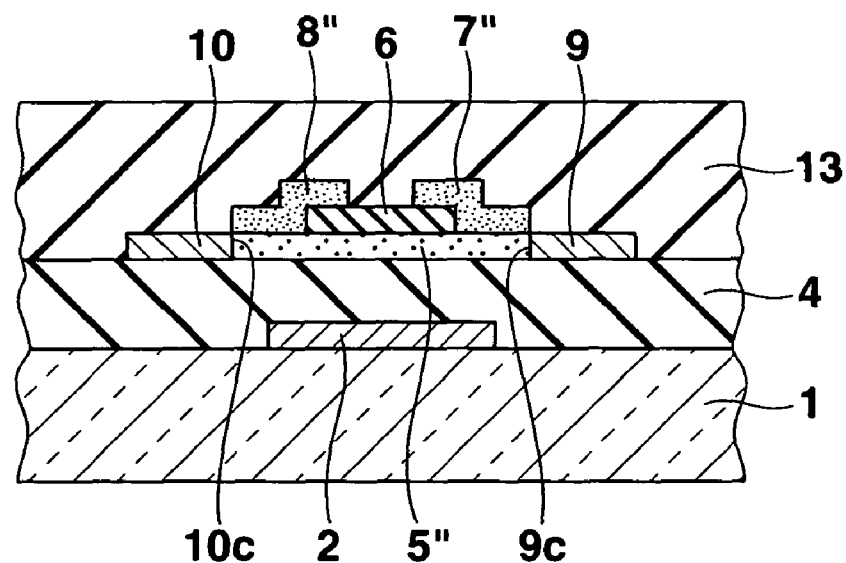
FIG. 13B is a sectional view taken along line $XIII_B$-$XIII_B$ of FIG. 12.
Figure 14:
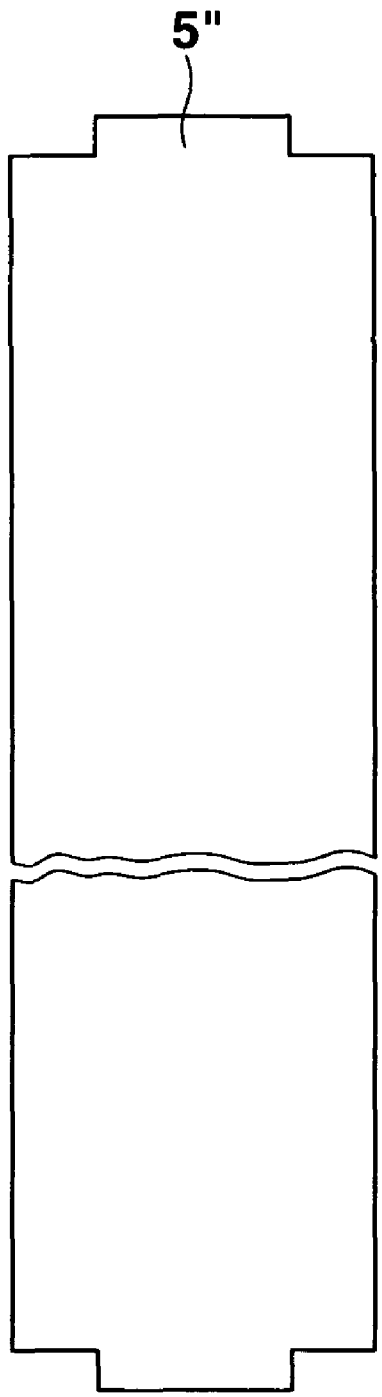
FIG. 14 is a plan view of a semiconductor thin film for photoelectric conversion shown in FIGS. 12, 13A, and 13B.
Figure 15:
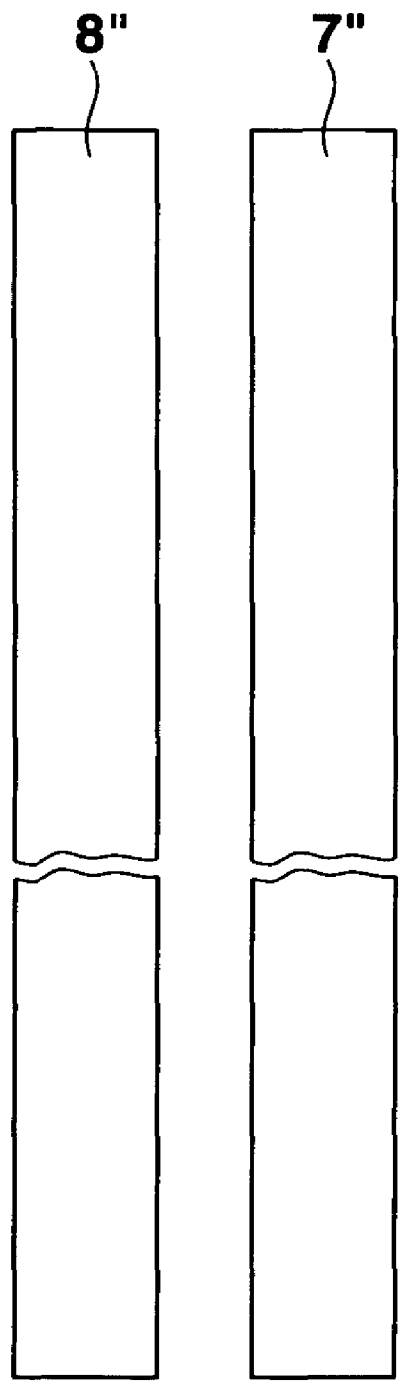
FIG. 15 is a plan view of an ohmic contact layer shown in FIGS. 12, 13A, and 13B.

FIGS. 12-15 illustrate the structure of the third embodiment of the present invention. FIG. 12 is a transparent plan view of a photosensor according to the third embodiment of the present invention. FIG. 13A is a sectional view taken along line $XIII_A$-$XIII_A$ of FIG. 12. FIG. 13B is a sectional view taken along line $XIII_B$-$XIII_B$ of FIG. 12. FIG. 14 is a plan view of a semiconductor thin film for photoelectric conversion shown in FIGS. 12, 13A, and 13B. FIG. 15 is a plan view of an ohmic contact layer shown in FIGS. 12, 13A, and 13B.

The same reference numerals are used to indicate the same elements as those described above with respect to the first embodiment. Reference numerals of structural elements that differ from the corresponding elements of the first embodiment are designated by a double prime symbol.

The photosensor according to the third embodiment differs, in particular, from the photosensor according to the first embodiment that is shown in FIGS. 1 to 4 in that according to the third embodiment a semiconductor thin film 5" for photoelectric conversion has a simple strip shape as shown in FIG. 14, and each of ohmic contact layers 7" and 8" has a simple strip shape, as shown in FIG. 15. That is, the semiconductor thin film 5" and ohmic contact layers 7" and 8" have no notched portions, whereby according to the third embodiment only a source electrode 9 and a drain electrode 10 have notched portions 9c and 10c.

Other Embodiments

According to the embodiments described above, the channel length L is 9 μm, and the channel width W is considerably large, i.e., as large as 20,000 μm. However, the values for the channel length L and the channel width W given above are merely examples to which the present invention is not limited, and proper values can be selected as needed. For example, the channel width W may be decreased. When the channel width W is decreased, the source electrode, drain electrode, and the like may have one or several notched portions.

In addition, according to the embodiments described above, the photosensor is of the channel protective film type having the channel protective film 6. However, the present invention is not limited to this, and is also applicable to a channel edge type photosensor without the channel protective film 6, for example. In this case, in order to ensure the channel length L, the distance between the opposing end faces of the protruding portions 9b and 10b of the source electrode 9 and drain electrode 10 may be set to be equal to the channel length L.

Additional advantages and modifications will readily occur to those skilled in the art. Thus, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photosensor comprising:
   a gate electrode;
   a channel protective film having a rectangular shape, two long sides of which extend along a channel width direction, the channel protective film entirely overlapping the gate electrode;
   a semiconductor thin film for photoelectric conversion having a first strip portion arranged to overlap the channel protective film and a plurality of first protruding portions protruding from the first strip portion on a first side along a channel length direction; and
   a source electrode having a second strip portion arranged to be located on the first side relative to the channel protective film and extending along the channel width direction and a plurality of second protruding portions protruding from the second strip portion along the channel length direction toward the channel protective film,
   wherein the source electrode is arranged so that the second protruding portions overlap the first protruding portions and at least a part of the first strip portion, and
   wherein an area of the first strip portion corresponding to an area between two adjacent ones of the second protruding portions is exposed from the source electrode.

2. The photosensor according to claim 1, wherein the semiconductor thin film further comprises a plurality of third protruding portions protruding from the first strip portion on a second side different from the first side along the channel length direction.

3. The photosensor according to claim 2, further comprising a drain electrode having a third strip portion arranged to be located on the second side relative to the channel protective film and extending along the channel width direction and a plurality of fourth protruding portions protruding from the third strip portion along the channel length direction toward the channel protective film, wherein an area of the first strip portion corresponding to an area between two adjacent ones of the fourth protruding portions is exposed from the drain electrode.

4. The photosensor according to claim 3, wherein the source electrode and the drain electrode are shaped in line-symmetric forms with respect to an axis along the channel width direction.

5. The photosensor according to claim 3, wherein the source electrode and the drain electrode have a light-shielding property.

6. The photosensor according to claim 3, further comprising an ohmic contact layer formed as a layer between the semiconductor thin film and the drain electrode.

7. The photosensor according to claim 1, wherein the semiconductor thin film is formed as a layer between the gate electrode and the channel protective film.

8. The photosensor according to claim 1, further comprising an ohmic contact layer formed as a layer between the semiconductor thin film and the source electrode.

9. A photosensor comprising:

a gate electrode;

a channel protective film having a rectangular shape, two long sides of which extend along a channel width direction, the channel protective film entirely overlapping the gate electrode;

a semiconductor thin film for photoelectric conversion having a first strip portion arranged to overlap the channel protective film and a plurality of first protruding portions protruding from the first strip portion on a first side along a channel length direction; and a source electrode having a second strip portion arranged to be located on the first side relative to the channel protective film and extending along the channel width direction and a plurality of second protruding portions protruding from the second strip portion along the channel length direction toward the channel protective film, wherein the semiconductor thin film is arranged so that the first protruding portions and at least a part of the first strip portion overlap the second protruding portions, and wherein the source electrode has a first cut portion to expose a part of the first strip portion through an area between two adjacent ones of the second protruding portions.

10. The photosensor according to claim 9, wherein the semiconductor thin film further includes a plurality of third protruding portions protruding from the first strip portion on a second side different from the first side along the channel length direction.

11. The photosensor according to claim 10, further comprising a drain electrode having a third strip portion arranged to be located on the second side relative to the channel protective film and extending along the channel width direction and a plurality of fourth protruding portions protruding from the third strip portion along the channel length direction toward the channel protective film, wherein the semiconductor thin film is arranged so that the third protruding portions and at least a part of the first strip portion overlap the fourth protruding portions, and wherein the drain electrode has a second cut portion to expose a part of the first strip portion through an area between two adjacent ones of the fourth protruding portions.

12. The photosensor according to claim 11, wherein the source electrode and the drain electrode are shaped in line-symmetric forms with respect to an axis along the channel width direction.

13. The photosensor according to claim 11, wherein the source electrode and the drain electrode have a light-shielding property.

14. The photosensor according to claim 11, further comprising an ohmic contact layer formed as a layer between the semiconductor thin film and the drain electrode.

15. The photosensor according to claim 9, wherein the semiconductor thin film is formed as a layer between the gate electrode and the channel protective film.

16. The photosensor according to claim 9, further comprising an ohmic contact layer formed as a layer between the semiconductor thin film and the source electrode.

\* \* \* \* \*